(12) United States Patent
Perkins

(10) Patent No.: US 7,148,491 B2
(45) Date of Patent: Dec. 12, 2006

(54) SUPER ALLOY IONIZATION CHAMBER FOR REACTIVE SAMPLES

(75) Inventor: Patrick D. Perkins, Sunnyvale, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/217,263

(22) Filed: Aug. 31, 2005

(65) Prior Publication Data

US 2006/0017018 A1    Jan. 26, 2006

Related U.S. Application Data

(62) Division of application No. 10/810,396, filed on Mar. 25, 2004, now Pat. No. 6,974,956, which is a division of application No. 09/894,204, filed on Jun. 28, 2001, now Pat. No. 6,765,215.

(51) Int. Cl.
*H01J 27/00* (2006.01)
(52) U.S. Cl. .................. 250/423 R; 250/288
(58) Field of Classification Search ............ 250/423 R, 250/288
See application file for complete search history.

(56) References Cited

U.S. PATENT DOCUMENTS

| | | | |
|---|---|---|---|
| 3,423,584 A | 1/1969 | Erickson | |
| 3,831,351 A | 8/1974 | Danby et al. | |
| 4,883,969 A | 11/1989 | Ishida et al. | |
| H909 H | 4/1991 | Danby et al. | |
| 5,075,966 A | 12/1991 | Mantkowski | |
| 5,150,010 A | 9/1992 | Kageyama | |
| 5,160,841 A | 11/1992 | Chapman et al. | |
| 5,283,414 A | 2/1994 | Straemke | |
| 5,726,447 A | 3/1998 | Aisawa et al. | |
| 5,736,741 A | 4/1998 | Bertsch et al. | |
| 5,753,910 A | 5/1998 | Gourley et al. | |
| 5,756,996 A | 5/1998 | Bier et al. | |
| 5,789,745 A | 8/1998 | Martin et al. | |
| 5,856,651 A | 1/1999 | Shaffer | |
| 6,037,587 A | 3/2000 | Dowell et al. | |
| 6,049,077 A | 4/2000 | Franzen | |
| 6,765,215 B1 | 7/2004 | Perkins | |
| 6,974,956 B1 * | 12/2005 | Perkins | 250/423 R |

* cited by examiner

*Primary Examiner*—Kiet T. Nguyen

(57) ABSTRACT

The present invention relates to an ionization source having a chamber for ionizing a sample. The ionization chamber has surfaces to reduce the overall interaction with reactive samples. The inner surface walls of the ionization chamber or the ionization chamber may be formed from an inert super alloy. For instance, Inconel™ 625, Inconel™ 601 or Hastelloy® may comprise the ionization chamber or the surface walls of the ionization chamber. The invention also includes a method for reducing the interaction of a reactive analyte with an ion source.

1 Claim, 3 Drawing Sheets

| Part | RRF 160 ng | RRF 120 ng | RRF 80 ng | RRF 50 ng | RRF 20 ng | RRF 10 ng | Ave. RRF |
|---|---|---|---|---|---|---|---|
| Freshly cleaned 316 stainless steel ion source | 0.144 | 0.153 | 0.108 | 0.091 | 0.051 | 0.023 | 0.095 |
| Inconel 625 ion source | 0.259 | 0.214 | 0.243 | 0.235 | 0.193 | 0.161 | 0.221 |

Relative response factors (RRF) for 2,4 – dinitrophenol as a function of the material of the ion source

FIG. 2

SUPER ALLOY IONIZATION CHAMBER FOR REACTIVE SAMPLES

CROSS-REFERENCE

This application is a divisional of Ser. No. 10/810,396, filed on Mar. 25, 2004, now U.S. Pat. No. 6,974,956 which application is a divisional of Ser. No. 09/894,204, filed Jun. 28, 2001, now U.S. Pat. No. 6,765,215.

TECHNICAL FIELD

This invention relates generally to ion source chambers for use in mass spectrometry. More particularly, the invention relates to an ionization chamber made of a "super alloy" that provides reduced interaction with reactive samples.

BACKGROUND

Typical mass spectrometers contain an ion source having an ionization chamber. A sample containing an analyte is introduced into the ionization chamber through a means for sample introduction. Once the analyte is disposed within the ionization chamber, an ionization source produces ions from the sample. The resultant ions are then processed by at least one analyzer or filter that separates the ions according to their mass-to-charge ratio. The ions are collected in a detector, which measures the number and distribution of the ions, and a data processing system uses the measurements from the detector to produce the mass spectrum of the analyte. The sample can be in gaseous form or, depending upon the particular analyte separation and ionization means, can initially be a component of a liquid or gel.

There are many types of ion sources that are useful in mass spectrometry (hereinafter referred to as MS). Sources of ionization sources include, but are not limited to, electron impact, chemical ionization, plasma, fast ion or atom bombardment, field desorption, laser desorption, plasma desorption, thermospray and electrospray. Two of the most widely used sources for gaseous analytes are the electron impact (hereinafter referred to as EI) and chemical ionization (hereinafter referred to as CI) sources.

An EI source generally contains a heated filament giving off electrons that are accelerated toward an anode and collide with gaseous analyte molecules introduced into the ionization chamber. Typically, the electrons have energies of about 70 eV and produce ions with an efficiency of less than a few percent. This energy is typically chosen because it is well in excess of the minimum energy required to ionize and fragment molecules and is at or near the peak of the ionization efficiency curve for most molecules. The total pressure within the ionization source is normally held at less than about $10^{-3}$ torr. The ions produced are extracted from the EI source with an applied electric field and introduced into an analyzer wherein they are separated by mass-to-charge ratio. The selected ions are registered as an ion current characteristic of the specified mass/charge by the ion detection and signal processing system of the mass spectrometer. Those ions ideally do not collide with other molecules or surfaces from the time they are formed in the EI source until the time they are collected in the detector. An EI source is often employed in MS in conjunction with gas chromatography (GC), which separates constituents of the analyte by time of elution.

The EI ion source is often used with a quadrupole mass spectrometer for reasons of stability and reproducibility of ion-fragmentation patterns. The patterns produced can be compared with "classical" spectra libraries and the ion's molecular composition thereby determined. Thus the quality of the spectral pattern produced by the ion source may greatly effect the interpretation of data.

In EI, the character and quantity of analyzable ions from the molecules in the sample depend upon reactions occurring on the inner surfaces of the chamber containing the source of ionization. First, the analyte is introduced into an ionization chamber wherein ionization of the analyte is intended. Before ionization, however, much of the sample is exposed to inner surfaces of the chamber, which are usually heated. The interaction of the sample with these surfaces may create an undesired effect. For example, if a portion of the sample adheres to the chamber surface, the portion cannot be effectively ionized and directed to the detector. As a result, the sensitivity of the apparatus for analysis of that analyte may suffer. In addition, the sample can degrade, i.e., convert to other compounds or be adsorbed onto the surface of the chamber and desorb later. Depending upon the compound, many unexpected ions can appear as a result of the interaction of the compound with the surfaces. The results are undesirable: chromatographic peak tailing, loss of sensitivity, nonlinearity, erratic performance and the like.

In addition, cleanliness is critical to the proper performance of the mass spectrometer using an EI source, particularly for quantitative analysis of material in a low concentration, such as for GC/MS analysis of pesticide residues, drug residues and metabolites, environmental samples and trace analysis of organic compounds. The relatively non-volatile materials in the sample matrix generally form insulating deposits on the surface of the chamber that take on an electrical charge. This charge distorts the applied electric field causing anomalies in ion production. Often, abrasive cleaning is employed to ensure that the chamber is substantially free of insulating deposits.

In contrast to the EI ion source, a CI source produces ions through collision of the molecules in the analyte with primary ions present in the ionization chamber or by attachment of low energy electrons present in the chamber. A CI source operates at much higher pressures than an EI source in order to permit frequent collisions. The overall pressure in a CI source during operation typically ranges from about 0.1 to about 2 torr. This pressure may be produced by the flow of a reagent gas, such as methane, isobutane, ammonia or the like, that is pumped into the chamber containing the CI source. In a typical configuration, both the reagent gas and the analyte are introduced through gas-tight seals into the chamber containing the CI source. The reagent gas and the analyte are sprayed with electrons having energies of 50 to 300 eV from a filament through a small orifice, generally less than 1 mm in diameter. Ions formed are extracted through another small orifice, also generally less than 1 mm in diameter, and introduced into the analyzer or filter. Electric fields may be applied inside the CI source, but they are usually not necessary for operation of the CI source. Ions eventually leave the CI source through a combination of diffusion and entrainment in the flow of the reagent gas. Thus, it is evident that CI sources operate in a substantially different manner from EI sources. However, the same undesired interactions of the sample with the source chamber surfaces may occur in a CI source as in an EI source as mentioned above.

Efforts have been made to address sample degradation problems in the ionization chamber of a mass spectrometer, particularly those containing an EI ion source, by substituting for or modifying the surfaces of the ionization chamber. Such efforts include providing a metallic surface with advantageous properties. For example, ionization chambers have been made with electropolished stainless steel surfaces in efforts to reduce the total active surface area. However, mass spectrometers using such ionization chambers have been found to give variable results and still exhibit degradation of the analyte over time. U.S. Pat. No. 5,055,678 to Taylor et al. describes the use of a chromium or oxidized chromium surface in a sample analyzing and ionizing apparatus, such as an ion trap or EI ionization chamber, to prevent degradation or decomposition of a sample in contact with the surface. This reference also describes that coating the inner surface of the ionization chamber with materials known for corrosion resistance or inertness, such as gold, nickel and rhodium, may reduce degradation of analytes, such as pesticides, drugs and metabolites, to some degree. Such surfaces suffer from a variety of drawbacks such as susceptibility to scratching when the metal coating is soft or assembly/disassembly difficulties when the coating has a high coefficient of friction.

In addition, U.S. Pat. No. 5,633,497 to Brittain et al. describes the use of a thin coating of an inert, inorganic non-metallic insulator or semiconductor material on the interior surfaces of an ion trap or EI ionization chamber to reduce adsorption, degradation or decomposition of a sample contacting the chamber surface. The material disclosed in this reference was fused silica, with aluminum oxide, silicon nitride and "selected semiconductors" given as alternative embodiments. Because these surface coatings exhibit high electrical resistivity, however, electrical charge can undesirably accumulate on these coatings if the coatings are too thick. The important feature of the invention described in this reference is the use of a sufficiently thin coating of insulator that charging effects do not occur.

U.S. Pat. No. 5,796,100 to Palermo discloses a quadrupole ion trap having inner surfaces formed from molybdenum.

In addition, U.S. Pat. No. 6,037,587 to Dowell et al. describes a mass spectrometer having a CI source containing a chemical ionization chamber having inner surfaces formed from molybdenum.

Others have attempted to prevent degradation problems by treating the inner metal surfaces of the analytical apparatus with a passivating agent to mask or destroy active surface sites. For example, alkylchlorosilanes and other silanizing agents have been used to treat injectors, chromatographic columns, transfer lines and detectors in GC. See, e.g., U.S. Pat. No. 4,999,162 to Wells et al. Such treatments have been successful in deactivating metal surfaces and thus have prevented degradation of some species of analyte. Unfortunately, the materials used for such treatments have a sufficiently high vapor pressure to introduce organic materials in the gas phase within the volume of the ionization chamber that are ionized along with the analyte, producing a high chemical background in the mass spectrum.

One problem with the described techniques is that each of the metals is applied as a coating. Over time, the coatings will begin to wear or tarnish. It, therefore, would be desirable to be able to construct an ionization chamber for reactive samples that employs a single metal or alloy. This provides for longer wear as well as makes the manufacture of the parts less complicated.

To date, there are very few patents or inventions related to the use of "super alloys" with mass spectrometer parts. For instance, U.S. Pat. No. 6,025,591, discloses the use of a nickel coating on glass fibers to make conducting surfaces for the quadrupole of a mass spectrometer. Furthermore, U.S. Pat. No. 5,625,185 claims the use of graphite for entrance lenses of the ion optics of an ICP-MS system to avoid sputtering effects seen when using normal steels containing iron, nickel, and chromium.

Thus, there is a need to reduce the adsorption, degradation and decomposition of these important analyte ions in an ionization chamber and to mitigate the problems associated with known coatings.

SUMMARY OF THE INVENTION

The invention provides an apparatus and method for improved sample ionization within an ionization chamber of a mass spectrometer. The ionization chamber comprises an inert super alloy such as Inconel™ 625, Inconel™ 601, or Hastelloy®. The super alloy may also be applied as a coating to the ionization chamber. The super alloy contains a low iron content that provides for reduced absorption, decomposition and reaction of the samples with the ionization chamber.

BRIEF DESCRIPTION OF THE FIGURES

The invention is described in detail below with reference to the following figures:

FIG. 2 is a table that compares relative response factors (RRFs) of 2,4-dinitrophenol for the following ion source materials: stainless steel and Inconel™ 625.

DETAILED DESCRIPTION OF THE INVENTION

Before describing the invention in detail, it must be noted that, as used in this specification and the appended claims, the singular forms "a," "an," and "the" include plural referents unless the context clearly dictates otherwise. Thus, for example, reference to "a material" includes combinations of materials, reference to "a compound" includes mixtures of compounds, reference to "an ion source" includes more than one ion source, reference to "a chamber" includes a plurality of chambers, and the like.

In describing and claiming the present invention, the following terminology will be used in accordance with the definitions set out below.

The term "ionization chamber" refers to solid structure that substantially encloses a volume in which the sample, typically a gas, is ionized. The solid structure may also constitute part of a mass analyzer; for example, an ion trap wherein electron impact or chemical ionization occurs inside the trap.

The term "inner surface" refers to any surface within the chamber that can be subject to undesirable interaction with the analyte. The term encompasses surfaces of a component that may not be a part of the chamber, but that is disposed within the chamber, such as means for sample introduction.

The term "microstructure" is used herein to refer to a microscopic structure of a material and encompasses concepts such as lattice structure, degrees of crystallinity, dislocations, grain boundaries and the like.

The term "super alloy" refers to an alloy both inert and non-inert that provides resistance to abrasion and corrosion and that has a low iron content. A low iron content means an alloy having an iron content of less than 25%. The super alloy contains 10–30% chromium and less than 30% molybdenum. Nickel comprises at least 40% of the super alloy and is the highest element percentage. Examples are materials having the names Inconel™ and Hastelloy®.

The term "Inconel™ 625" refers to a super alloy material comprising at least 58% nickel, 20–23% chromium, 0.1% carbon, 0.5% manganese, 0.5% silicon, no more than 5.0% iron, no more than 0.015% sulfur, no copper, no more than 0.40% aluminum, no more than 0.40% titanium, no more than 0.015% lead, no more than 1% cobalt, 3.15–4.15% niobium, no boron, and 8.0–10.0% molybdenum.

The term "Inconel™ 601" refers to a super alloy material comprising 58.0–63.0% Nickel, 21.0–25.0% Chromium, 1.0–1.7% aluminum, less than 0.10% carbon, less than 1.0% manganese, less than 0.015% sulfur, less than 0.50% silicon, less than 1.0% copper and the remaining percent iron.

The term "Hastelloy®" refers to a super alloy material comprising 0–0.4% aluminum, 0–0.016% boron, 0–0.5% columbium and niobium, 1.5–5.0% cobalt, 16–30% chromium, 0–2% copper, 3–20% iron, 0.5–1.5% manganese, 2.5–16% molybdenum, 43–71% nickel, 0.08–5% silicon, 0.07% or less titanium, 4% or less tungsten, 0.35% or less vanadium.

Figure 1A:
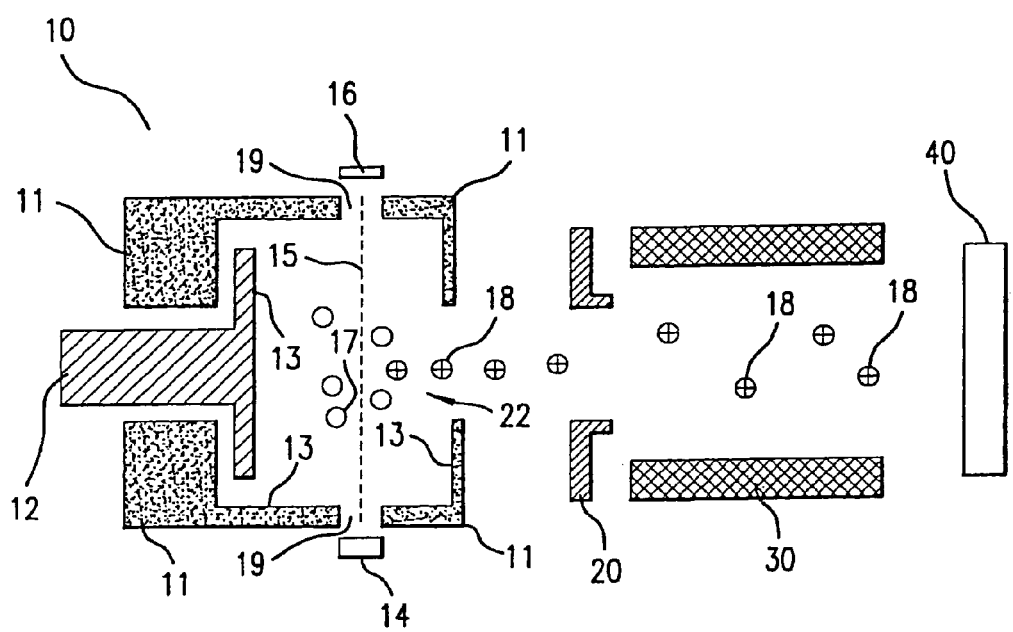
FIG. 1A is a simplified diagrammatic sketch in a section view showing a first embodiment of the mass spectrometer containing an EI chamber that incorporates the invention.
Figure 1B:
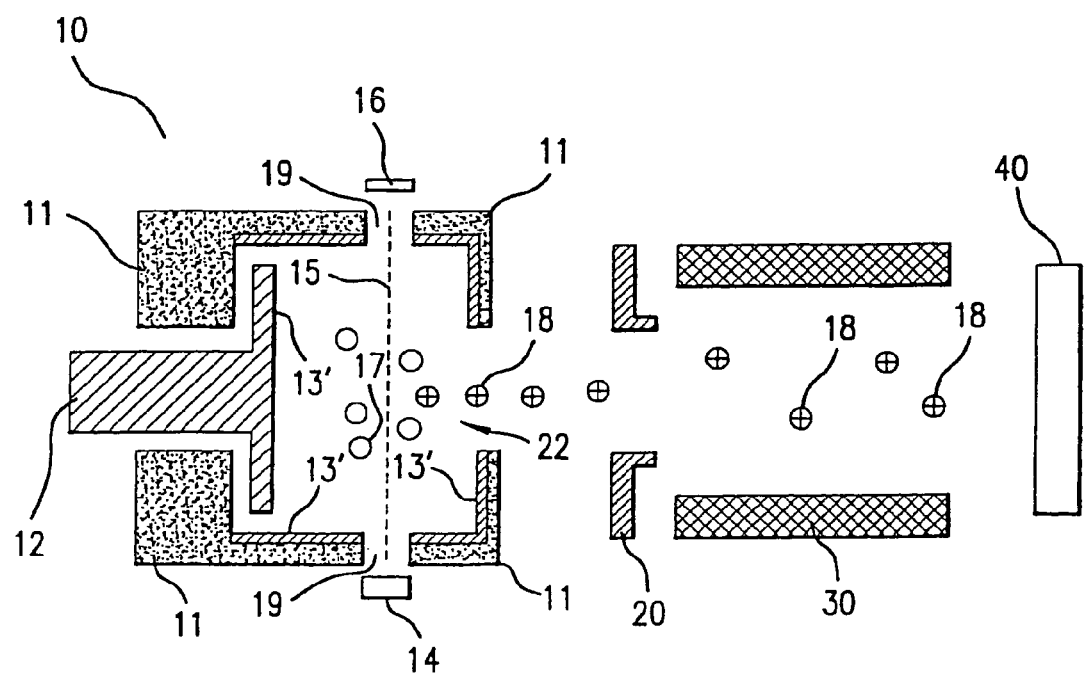
FIG. 1B is a simplified diagrammatic sketch in a section view showing a second embodiment of the mass spectrometer containing an EI chamber that incorporates the invention.

The invention is described herein with reference to the figures. The figures are not to scale, and in particular, certain dimensions may be exaggerated for clarity of presentation. FIG. 1A schematically illustrates a quadrupole mass spectrometer. Although the present example or diagram illustrates an EI source, the invention should not be construed narrowly to only this particular source and can be applied to other sources known in the art. An EI source 10 typically comprises an ionization housing or substrate 11, a repeller electrode 12 and inner surfaces 13 that define a chamber 22 (See FIG. 1A). Housing or substrate 11 as well as repeller electrode 12, may comprise any of the Inconel™ 625 and super alloy materials discussed below. In a second embodiment of the invention, inner surfaces 13' may be applied as a coating to substrate or housing 11 (coating can be applied to all inner surfaces of the chamber as well as to the repeller electrode) (See FIG. 1B). Coating 13' may comprise any of super alloy and Inconel™ materials discussed below or incorporated by reference. In this embodiment of the invention, substrate or housing 11 may comprise an electrically-conducting material. In the case of EI, the analyte gas 17 typically is introduced as a sample stream from a GC apparatus (not shown) into the chamber through an inlet orifice (not shown). An electron beam 15 that passes through orifices 19 into the chamber 22, from a filament 14 to an electron collector 16, interacts with the analyte molecules 17 of the analyte gas stream. The interaction results in formation of analyte ions 18 that are repelled by the repeller electrode 12 that is charged to a repelling voltage with respect to the ions. The repelling voltage has the same polarity as that of the analyte ions. The repelling force drives the ions through a lens system 20 and a mass analyzer 30 that selects the ions by mass-to-charge ratio. When the ions 18 reach the detector system 40, their abundance is measured to produce a mass spectrum for the sample. The quadrupole mass filter is preferred for the invention, but various types of analyzers are also known in the art, e.g., ion traps, time-of-flight instruments and magnetic sector spectrometers.

It has now been discovered that Inconel™ 625, Inconel™ 601, Hastelloy® and super alloys render surfaces within an ionization chamber more inert with respect to certain known reactive analytes than typical chamber surface materials such as stainless steel, gold, nickel, chromium and chromium oxides, fused silica, aluminum oxide and molybdenum. Those reactive analytes include, but are not limited to, acetophenone, 2-acetylaminofluorene, 1-acetyl-2-thiourea, aldrin, 4-aminobiphenyl, aramite, barban, benzidine, benzoic acid, benzo(a)pyrene, 1,4-dichlorobenzene, 2,4-dinitrophenol, hexachlorocyclopentadiene, 4-nitrophenol, N-nitroso-di-n-propylamine and other compounds that occur in various solid waste matrices, soils, and water samples.

Alternatively, the super alloy may be employed as an inner surface for an ionization chamber. The super alloy may exhibit a layered microstructure. Examples of super alloy compounds include, but are not limited to Inconel™ 625, Inconel™ 601 and Hastelloy®. Surprisingly, these materials have also been found to be inert with respect to certain known reactive analytes and to be hard and mechanically robust.

If the ionization chamber is coated with a dielectric, static charge will accumulate on the dielectric during the ionization process. Such charging will cause arcing resulting in a false signal, or such charge distribution may distort the field, thereby altering the ability of the ionization chamber to produce ions. Thus, if an inert coating is employed on any inner surface of the ionization chamber, it is preferred that the coating is sufficiently electrically conductive to allow dissipation of charge, as disclosed below. Materials having a lower resistivity may be deposited in a thicker coating on an inner surface of the ionization chamber. Irrespective of the resistivity of the coating, the coating should be uniformly deposited to insure that there are no uncoated areas or pinholes as well as to provide sufficient coverage to mask active sites on the surface. As is evident, any surface of the ionization chamber, including the surfaces of the electrodes, is subject to reaction with the uncharged reagent gas or the analyte.

There are many methods that can be employed to coat the compounds of the present invention onto the inner surface of an ionization chamber. One method involves a two-step process: depositing a thin layer of a metal or alloy on the surface of interest and exposing the surface to an appropriate element under reaction conditions effective to form the desired compound. There are many ways in which a thin layer of metal can be deposited, e.g., by evaporation, sputtering, electroplating, chemical vapor deposition (CVD), physical vapor deposition (PVD), etc, as is known in the art. It is notable, though, that not all methods of metallic layer deposition can be employed with ease for any particular metal. For example, a metal with a low melting point or boiling point temperature is particularly suitable for deposition through evaporation. Conversely, metals with a high melting point such as tungsten are not easily deposited through evaporation. Once a layer of metal is deposited, the layer can be exposed to a source of an appropriate electronegative element under suitable conditions to form the desired compound. It is evident that proper film formation conditions may involve high temperature processing; therefore, the material on which the surface is to be converted must be able to withstand all processing condition.

Alternatively, the compounds of the present invention may be deposited on the surface in vacuum processes that do not involve two discrete steps as described above. Such vacuum processes include, but are not limited to, cathodic arc PVD, electron-beam evaporation, enhanced arc PVD, CVD, magnetronic sputtering, molecular beam epitaxy, combinations of such techniques and a variety of other techniques known to one of ordinary skill in the art. One of ordinary skill in the art will recognize that CVD usually involves heating a substrate surface to a sufficiently high temperature to decompose gaseous organic species to form the desired film. Such heating usually precludes the use of plastic as a surface on which the film is deposited. PVD, on the other hand, does not necessarily exclude plastics as a substrate and allows for masked film deposition. However, the method coats only surfaces that are within the "line of sight" of the source of the coating material, and "blind" spots are not coated. In addition, some substrate heating may be employed in physical vapor deposition to promote film adhesion.

In addition, differences in thermal expansion coefficient between the coating layer and the surface on which the coating is deposited can also contribute to adhesion problems if the surfaces are subject to drastic changes in temperature.

The particular coating technique used generally affects the microstructure, morphology, and other physical characteristics of the deposited material. In addition, when the aforementioned deposition techniques are employed, variations in processing parameters can substantially change the morphology of the deposited film. In general, it is desirable to produce a smooth film of generally uniform thickness. Smooth films tend to provide a lower surface area, thereby rendering the film kinetically unfavorable for reaction with analytes. Smoothness of the film will, however, be highly dependent on, and in general determined by, the smoothness of the underlying surface.

As another alternative, the surface coating material can be applied as a powder. One method of powder application involves providing the conductive compound in powdered form and employing high pressure to spray the powder entrained in a fluid at high velocity such that the powder mechanically adheres to the surface. Another method involves suspending the powder in a solvent to form a paint, applying the paint onto the surface, and evaporating the solvent. The solvent can be a relatively inert carrier or one that facilitates chemical bonding between the powder particles or between the powder and the surface. In addition, heat can be applied to evaporate the solvent or to promote chemical bonding. Typically, no organic binder is used because organic materials generally outgas at sufficiently high vapor pressure to produce a gas phase that is ionized along with the sample, producing a high background in the mass spectrum. However, the film of the present invention does not necessarily preclude inclusion of a small amount of an organic binder if overall outgassing is sufficiently low. However, one drawback to this method is that the resulting coating does not withstand abrasive cleaning as well and may have to be reapplied over time.

Variations of the foregoing will be apparent to those of ordinary skill in the art. For example, while these coatings may be applied to surfaces composed of stainless steel, such coatings can also be applied to other surfaces such as aluminum or other structural materials that are typically used to form an ionization chamber or other components of a mass spectrometer. In addition, some compounds will be especially inert with respect to some analytes, and a particular coating may be applied to a surface that is designed for exposure to a specific analyte. For example, dinitrophenols are particularly reactive to components of conventional mass spectrometers.

It is to be understood that while the invention has been described in conjunction with the preferred specific embodiments thereof, that the foregoing description as well as the examples that follow is intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entireties.

EXAMPLE 1

A freshly cleaned inner surface of a 316 stainless steel ionization chamber was provided in an ion source of a mass spectrometer made by Agilent Technologies. The inner surface was cleaned by abrasion. Acenaphthene-$d_{10}$, a calibration standard, in a standard concentration, $C_{is}$, of 40 ng/µL, was analyzed using the mass spectrometer. The response of the mass spectrometer at mass 164 was used for the detection of the acenaphthene-$d_{10}$. The analysis produced a peak area, $A_{is}$, for the internal standard. Then a series of analyte solutions were prepared that contained 2,4-dinitrophenol in concentrations, $C_s$, of 160, 120, 80, 50, 20 and 10 ng/µL. The response of the mass spectrometer at mass 184 was used for the detection of 2,4-dinitrophenol. Each solution was analyzed by the mass spectrometer, resulting in a series of peak areas, $A_s$. For each solution, a relative response factor (RRF) was determined according to the following equation:

$$RRF=(A_s \times C_{is})/(A_{is} \times C_s). \qquad (I)$$

The RRF for each solution is reported in FIG. 2. These RRFs provide a standard against which the inertness of the material is evaluated.

EXAMPLE 2

The parts forming the ionization chamber in Example 1 above were replaced with parts of the same dimensions, but made of Inconel™ 625. The series of analyte solutions containing 2,4-dinitrophenol was analyzed in the mass spectrometer. For each solution, RRF was determined according to equation (I). The RRF for each solution is reported in FIG. 2. It is evident that for all concentrations of 2,4-dinitrophenol, RRF was greater when parts were made of super alloys such as Inconel™ 625, Inconel™ 601, and Hastelloy®. This indicates that the super alloy surfaces are less reactive with respect to 2,4-dinitrophenol than a freshly cleaned 316 stainless steel surface with no coating.

The invention claimed is:

1. A method of reducing interaction of a reactive analyte with a surface of a mass spectrometer ion source, comprising applying a coating selected from the group consisting of Inconel™ 625, Inconel™ 601 and Hastelloy® to the surface.

* * * * *